(12) United States Patent
Haba et al.

(10) Patent No.: US 8,466,564 B2
(45) Date of Patent: Jun. 18, 2013

(54) ENHANCED STACKED MICROELECTRONIC ASSEMBLIES WITH CENTRAL CONTACTS AND IMPROVED GROUND OR POWER DISTRIBUTION

(75) Inventors: Belgacem Haba, Saratoga, CA (US); Wael Zohni, San Jose, CA (US); Richard Dewitt Crisp, Hornitos, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/278,506

(22) Filed: Oct. 21, 2011

(65) Prior Publication Data

US 2012/0153435 A1   Jun. 21, 2012

(30) Foreign Application Priority Data

Dec. 17, 2010   (KR) .................. 10-2010-0129888

(51) Int. Cl.
*H01L 23/48* (2006.01)
*H01L 29/40* (2006.01)

(52) U.S. Cl.
USPC .................. 257/777; 257/690; 257/784

(58) Field of Classification Search
USPC .................. 257/777, 784
See application file for complete search history.

(56) References Cited

U.S. PATENT DOCUMENTS

| | | | |
|---|---|---|---|
| 5,719,748 A | 2/1998 | Cullinan et al. | |
| 5,777,391 A * | 7/1998 | Nakamura et al. | 257/778 |
| 6,218,731 B1 * | 4/2001 | Huang et al. | 257/738 |
| 6,281,578 B1 * | 8/2001 | Lo et al. | 257/724 |
| 6,414,396 B1 * | 7/2002 | Shim et al. | 257/778 |
| 6,445,594 B1 * | 9/2002 | Nakagawa et al. | 361/776 |
| 6,452,279 B2 * | 9/2002 | Shimoda | 257/777 |
| 6,583,502 B2 | 6/2003 | Lee et al. | |
| 6,590,281 B2 * | 7/2003 | Wu et al. | 257/684 |

(Continued)

FOREIGN PATENT DOCUMENTS

| | | |
|---|---|---|
| KR | 20010081922 A | 8/2001 |
| KR | 20060120365 A | 11/2006 |
| KR | 10-0690247 B1 | 2/2007 |
| WO | 2008021575 A2 | 2/2008 |

OTHER PUBLICATIONS

Office Action from Korean Patent Application No. 10-2010-0129888 dated Jan. 18, 2011.

(Continued)

*Primary Examiner* — David Vu
*Assistant Examiner* — Earl Taylor
(74) *Attorney, Agent, or Firm* — Lerner, David, Littenberg, Krumholz & Mentlik, LLP

(57) ABSTRACT

A microelectronic assembly includes a dielectric element having at least one aperture and electrically conductive elements thereon including terminals exposed at the second surface of the dielectric element; a first microelectronic element having a rear surface and a front surface facing the dielectric element, the first microelectronic element having a plurality of contacts exposed at the front surface thereof; a second microelectronic element having a rear surface and a front surface facing the rear surface of the first microelectronic element, the second microelectronic element having a plurality of contacts exposed at the front surface and projecting beyond an edge of the first microelectronic element; and an electrically conductive plane attached to the dielectric element and at least partially positioned between the first and second apertures, the electrically conductive plane being electrically connected with one or more of the contacts of at least one of the first or second microelectronic elements.

22 Claims, 10 Drawing Sheets

U.S. PATENT DOCUMENTS

| | | | | |
|---|---|---|---|---|
| 6,600,221 B2* | 7/2003 | Kimura | | 257/686 |
| 6,703,713 B1* | 3/2004 | Tseng et al. | | 257/777 |
| 7,061,121 B2* | 6/2006 | Haba | | 257/777 |
| 7,132,752 B2* | 11/2006 | Saeki | | 257/777 |
| 7,276,786 B2* | 10/2007 | Cho et al. | | 257/686 |
| 7,397,115 B2* | 7/2008 | Lee | | 257/678 |
| 7,400,032 B2* | 7/2008 | Corisis et al. | | 257/686 |
| 7,514,796 B2* | 4/2009 | Saeki | | 257/777 |
| RE41,478 E* | 8/2010 | Nakamura et al. | | 257/777 |
| 7,777,350 B2* | 8/2010 | Sasaki et al. | | 257/777 |
| RE41,722 E* | 9/2010 | Nakamura et al. | | 257/778 |
| 7,973,401 B2* | 7/2011 | Lin et al. | | 257/686 |
| 8,174,101 B2* | 5/2012 | Lee et al. | | 257/678 |
| RE43,444 E* | 6/2012 | Nakamura et al. | | 257/778 |
| 2002/0053727 A1* | 5/2002 | Kimura | | 257/686 |
| 2003/0197284 A1* | 10/2003 | Khiang et al. | | 257/777 |
| 2004/0016999 A1 | 1/2004 | Misumi | | |
| 2005/0116358 A1* | 6/2005 | Haba | | 257/789 |
| 2005/0164486 A1 | 7/2005 | Lua et al. | | |
| 2006/0138650 A1* | 6/2006 | Hidalgo et al. | | 257/728 |
| 2009/0073664 A1 | 3/2009 | Winger | | |
| 2009/0085222 A1* | 4/2009 | Yamano | | 257/777 |
| 2012/0092832 A1* | 4/2012 | Haba et al. | | 361/709 |
| 2012/0153435 A1* | 6/2012 | Haba et al. | | 257/532 |
| 2012/0155042 A1* | 6/2012 | Haba et al. | | 361/782 |
| 2012/0155049 A1* | 6/2012 | Haba et al. | | 361/803 |

OTHER PUBLICATIONS

Search Report from Korean Patent Application No. 10-2010-0129888 dated Jan. 18, 2011.

Partial International Search for Application No. PCT/US2011/057294 dated May 8, 2012.

International Search Report and Written Opinion for Application No. PCT/US2011/057294 dated Jul. 27, 2012.

* cited by examiner

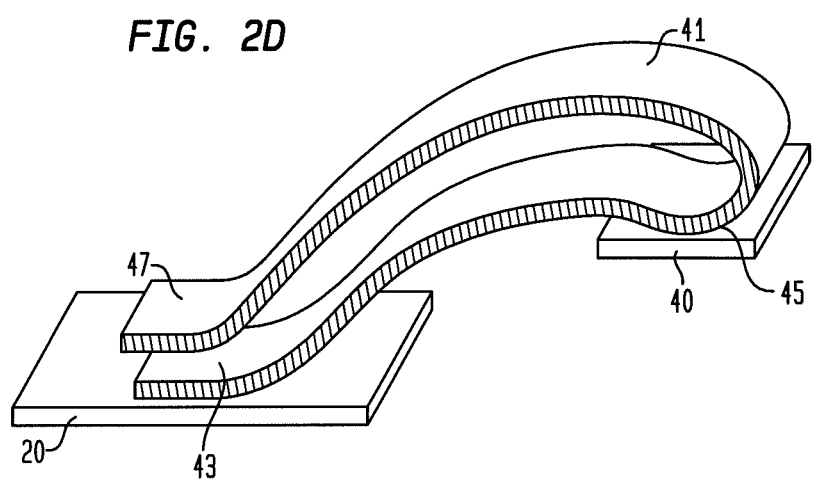

ENHANCED STACKED MICROELECTRONIC ASSEMBLIES WITH CENTRAL CONTACTS AND IMPROVED GROUND OR POWER DISTRIBUTION

CROSS-REFERENCE TO RELATED APPLICATIONS

The present application claims priority from Korean Patent Application No. 10-2010-0129888, filed on Dec. 17, 2010, the disclosure of which is hereby incorporated herein by reference.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low, overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148, 265; and U.S. Pat. No. 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

BRIEF SUMMARY OF THE INVENTION

The present disclosure relates to microelectronic assemblies. In one embodiment, the microelectronic assembly includes a dielectric element having at least one aperture and electrically conductive elements thereon including terminals exposed at the second surface of the dielectric element; a first microelectronic element having a rear surface and a front surface facing the dielectric element, the first microelectronic element having a plurality of contacts exposed at the front surface thereof; a second microelectronic element having a rear surface and a front surface facing the rear surface of the first microelectronic element, the second microelectronic element having a plurality of contacts exposed at the front surface and projecting beyond an edge of the first microelectronic element; and an electrically conductive plane attached to the dielectric element and at least partially positioned between the first and second apertures, the electrically conductive plane being electrically connected with one or more of the contacts of at least one of the first or second microelectronic elements. The entire electrically conductive plane may be positioned between the first and second apertures. The electrically conductive plane may be a power plane or a ground plane. Portions of the electrically conductive potential plane may extend to locations beyond outer edges of the first and second apertures. The electrically conductive plane may include at least two plane portions spaced apart from each other. The two plane portions may include a power plane portion electrically connected to at least some power contacts of at least one of the first or second microelectronic elements, and a ground plane portion electrically connected to contacts of one or more of the first or second microelectronic elements. The electrically conductive plane may be electrically coupled to one or more contacts of the first microelectronic element. The electrically conductive plane may be electrically coupled to one or more contacts of the second microelectronic element.

In another embodiment, the microelectronic assembly includes a dielectric element having oppositely-facing first and second surfaces and first and second apertures extending between the surfaces, the dielectric element further having a plurality of electrically conductive elements thereon; a first microelectronic element having a rear surface and a front surface facing the dielectric element, the first microelectronic element having a plurality of contacts exposed at the front surface thereof; a second microelectronic element having a rear surface and a front surface facing the rear surface of the first microelectronic element, the second microelectronic element having a plurality of contacts exposed at the front surface and projecting beyond an edge of the first microelectronic element; signal leads connected to one or more of the microelectronic elements and extending through the one or more of the first or second apertures to some of the conductive elements on the dielectric element; and one or more jumper leads extending through the first aperture and connected to a contact of the first microelectronic element, the one or more jumper leads spanning over the second aperture and being connected to a conductive element on the dielectric element.

In yet another embodiment, the microelectronic assembly includes a dielectric element having oppositely-facing first and second surfaces and first and second apertures extending between the surfaces, the dielectric element further having a plurality of electrically conductive elements thereon; a first microelectronic element having a rear surface and a front surface facing the dielectric element, the first microelectronic element having a plurality of contacts exposed at the front surface thereof; a second microelectronic element having a rear surface and a front surface facing the rear surface of the first microelectronic element, the second microelectronic element having a plurality of contacts exposed at the front surface and projecting beyond an edge of the first microelectronic element; signal leads connected to one or more of the microelectronic elements and extending through one or more of the first or second apertures to some of the conductive elements on the dielectric element; and one or more jumper leads spanning over at least one of the first or second aperture and connected to a conductive element on the dielectric element. The microelectronic assembly may further include an encapsulant disposed in the first aperture and covering the signal leads and the one or more jumper leads. The jumper leads may include an extended jumper lead extending from a conductive element on one side of the first aperture, across the first aperture, across a portion of the second surface between the first and second apertures, and through the second aperture to one of the microelectronic elements. The first and second apertures may have elongated shapes and extend substantially parallel to one another. The electrically conductive elements on the dielectric element include terminals may be exposed at the second surface of the dielectric element.

In a further embodiment, the microelectronic assembly includes a dielectric element having oppositely-facing first and second surfaces and one or more apertures extending between the surfaces, the dielectric element further having conductive elements thereon; a first microelectronic element having a rear surface and a front surface facing the first surface of the dielectric element, the first microelectronic element having a first edge and a plurality of contacts exposed at the front surface thereof; a second microelectronic element including having a rear surface and a front surface facing the rear surface of the first microelectronic element, a projecting portion of the front surface of the second microelectronic element extending beyond the first edge of the first microelectronic element, the projecting portion being spaced from the first surface of the dielectric element, the second microelectronic element having a plurality of contacts exposed at the projecting portion of the front surface; leads extending from contacts of the microelectronic elements through the at least one aperture to at least some of the conductive elements; and a first passive component disposed between the projecting portion of the front surface of the second microelectronic element and the first surface of the dielectric element. The microelectronic assembly may further include a second passive component exposed on the second surface of the dielectric assembly and between two apertures. The microelectronic assembly may further include a lead extending from a first passive component to a contact of one of the microelectronic elements. The dielectric element may include a plurality of terminals exposed on the second surface, each terminal being electrically coupled to a circuit board. The solder balls may connect each terminal to the circuit board. Copper pillars may connect each terminal to the circuit board. Each terminal may be connected to the first microelectronic element. Each terminal may be connected to the first and second microelectronic elements.

BRIEF DESCRIPTION OF THE DRAWINGS

FIG. 2D is a fragmentary partial sectional view illustrating a connection between bond elements in a variation of a microelectronic assembly in an embodiment herein;

DETAILED DESCRIPTION

Figure 1:
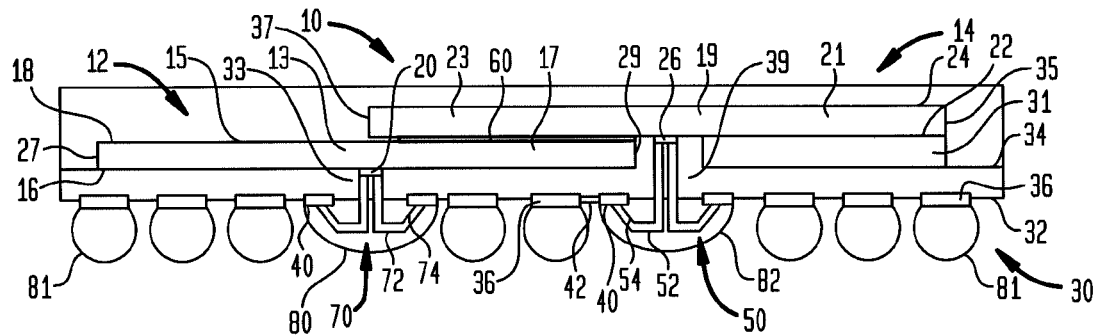
FIG. 1 is a diagrammatic sectional elevation view of a stacked microelectronic assembly according to an embodiment of the present invention.

With reference to FIG. 1, a stacked microelectronic assembly 10 according to an embodiment of the present invention includes a first microelectronic element 12 and a second microelectronic element 14. In some embodiments, the first and second microelectronic elements 12 and 14 may be a semiconductor chip, a wafer, or the like.

The first microelectronic element 12 has a front surface 16, a rear surface 18 remote therefrom, and first and second edges 27, 29, extending between the front and rear surfaces. The front surface 16 of the first microelectronic element 12 includes first and second end regions 15 and 17 and a central region 13 located between the first and second end regions 15 and 17. The first end region 15 extends between the central region 13 and first edge 27, and the second end region 17 extends between the central region 13 and the second edge 29. Electrical contacts 20 are exposed at the front surface 16 of the first microelectronic element 12. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure. The contacts 20 of the first microelectronic element 12 are exposed at the front surface 16 within the central region 13. For example, contacts 20 may be arranged in one or two parallel rows adjacent the center of first surface 16.

The second microelectronic element 14 has a front surface 22, a rear surface 24 remote therefrom, and first and second edges 35, 37, extending between the front and rear surfaces. The front surface 22 of the second microelectronic element 14 includes first and second end regions 21 and 23 and a central region 19 located between the first and second end regions 21 and 23. The first end region 21 extends between the central region 19 and first edge 35, and the second end region 23 extends between the central region 19 and the second edge 37. Electrical contacts 26 are exposed at the front surface 22 of the second microelectronic element 14. The contacts 26 of the second microelectronic element 14 are exposed at the front surface 22 within the central region 19. For example, contacts 26 may be arranged in one or two parallel row adjacent the center of first surface 22.

As seen in FIG. 1, the first and second microelectronic elements 12 and 14 are stacked relative to each other. In some embodiments, the front surface 22 of the second microelectronic element 14 and the rear surface 18 of the first microelectronic element 12 face each other. At least a portion of the second end region 23 of the second microelectronic element 14 overlies at least a portion of the second end region 17 of the first microelectronic element 12. At least a portion of the central region 19 of the second microelectronic element 14 projects beyond the second edge 29 of the first microelectronic element 12. Accordingly, the contacts 26 of the second microelectronic element 14 are positioned in a location beyond the second edge 29 of the first microelectronic element 12.

The microelectronic assembly 10 further includes a dielectric element 30 having oppositely-facing first and second surfaces 32 and 34. While FIG. 1 shows only one dielectric element 30, the microelectronic assembly 10 may include more than one dielectric element. One or more electrically conductive elements or terminals 36 are exposed at the first surface 32 of the dielectric element 30. At least some terminals 36 may be movable with respect to the first and/or second microelectronic element 12 and 14.

The dielectric element 30 may further include one or more apertures. In the embodiment depicted in FIG. 1, the dielectric element 30 includes a first aperture 33 substantially aligned with the central region 13 of the first microelectronic element 12 and a second aperture 39 substantially aligned with the central region 19 of the second microelectronic element 14, thereby providing access to contacts 20 and 26.

As seen in FIG. 1, the dielectric element 30 may extend beyond the first edge 27 of the first microelectronic element 12 and the first edge 35 of the second microelectronic element 14. The second surface 34 of the dielectric element 30 may be juxtaposed with the front surface 16 of the first microelectronic element 12. The dielectric element 30 may be partly or entirely made of any suitable dielectric material. For example, the dielectric element 30 may comprise a layer of flexible material, such as a layer of polyimide, BT resin or other dielectric material of the commonly used for making tape automated bonding ("TAB") tapes. Alternatively, the dielectric element 30 may comprise a relatively rigid, board like material such as a thick layer of fiber-reinforced epoxy, such as, Fr-4 or Fr-5 board. Regardless of the material employed, the dielectric element 30 may include a single layer or multiple layers of dielectric material.

The dielectric element 30 may also include electrically conductive elements 40 exposed on the first surface 32 and electrically conductive traces 42. The electrically conductive traces 42 electrically couple the electrically conductive elements 40 to the terminals 36.

A spacing layer 31, such as an adhesive layer, may be positioned between the first end region 21 of the second microelectronic element 14 and a portion of the dielectric element 30. If spacing layer 31 includes an adhesive, the adhesive may attach the second microelectronic element 14 to the dielectric material 30. Another spacing layer 60 may be positioned between the second end region 23 of the second microelectronic element 14 and the second end region 17 of the first microelectronic element 12. This spacing layer 60 may include an adhesive for bonding the first and second microelectronic elements 12 and 14 together. In such case, the spacing layer 60 may be partly or entirely made of a die-attach adhesive and may be comprised of a low elastic modulus material such as silicone elastomer. However, the spacing layer 60 may be entirely or partly made of a thin layer of high elastic modulus adhesive or solder if the two microelectronic elements 12 and 14 are conventional semiconductors chips formed of the same material, because the microelectronic elements will tend to expand and contract in unison in response to temperature changes. Irrespective of the materials employed, each of spacing layers 31 and 60 may include a single layer or multiple layers.

Figure 2:
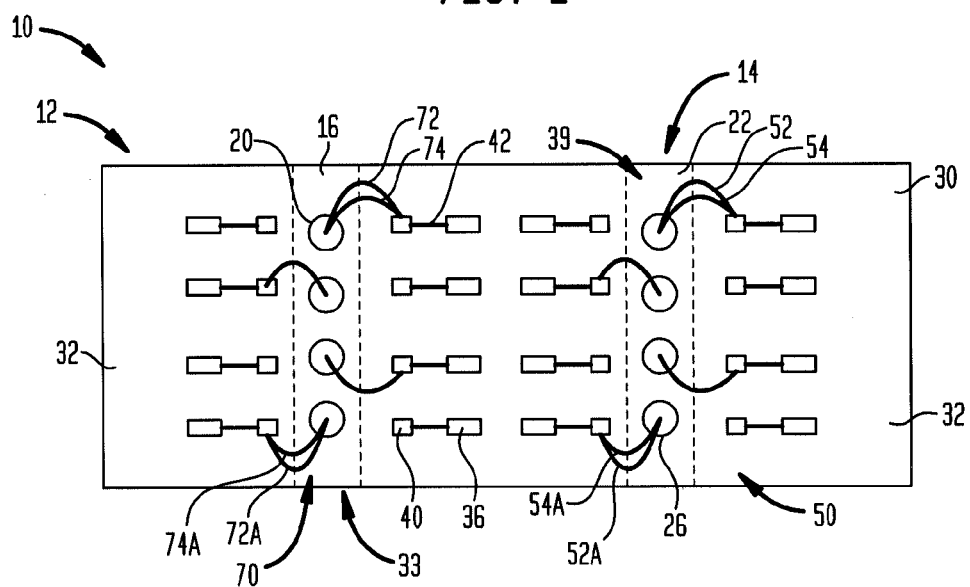
FIG. 2 is a bottom view of the stacked assembly of FIG. 1.

As seen in FIGS. 1 and 2, electrical connections or leads 70 electrically connect contacts 20 of the first microelectronic element 12 to some electrically conductive elements 40. Electrical connections 70 may include multiple wire bonds 72, 74. Wire bonds 72, 74 extend through the first aperture 33 and are oriented substantially parallel to each other. Each of the wire bonds 72 and 74 electrically couples a contact 20 to a corresponding element 40 of the dielectric element. A multiple wire bond structure according to this embodiment can substantially decrease inductance of a wire bond connection by providing an additional path for current to flow between the connected contacts.

Other electrical connections or leads 50 electrically couple contacts 26 of the second microelectronic element 14 to some elements 40. Electrical connections 50 may include multiple wire bonds 52, 54. Wire bonds 52, 54 extend through the second aperture 39 and are oriented substantially parallel to each other. Each of wire bonds 52 and 54 electrically couples a contact 26 to a corresponding element of the dielectric element 30. A multiple bond wire structure according to this embodiment can substantially decrease inductance of a wire bond connection by providing an additional path for current to flow between the connected contacts.

Figure 2A:
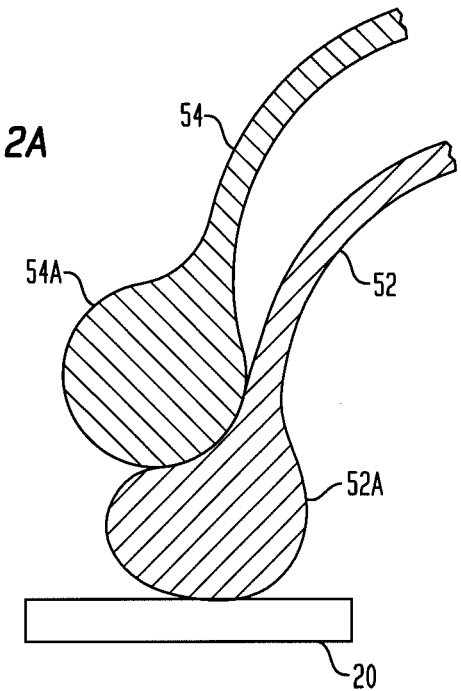
FIG. 2A is a fragmentary partial sectional view illustrating a connection between bond elements in a variation of a microelectronic assembly in an embodiment herein.

As seen in FIG. 2A, in electrical connection 70, the first bond wire 52 can have an end 52A metallurgically joined with the chip contact 20 and another end (not shown) metallurgically joined with the electrically conductive elements 40. For example, the bond wires can include a metal such as gold which can be welded using ultrasonic energy, heat, or both, to a contact to form a metallurgical joint or bond therewith. In contrast, the second bond wire 54 can have one end 54A metallurgically bonded to the end 52A of the first bond wire 52 and an opposite end (not shown) metallurgically bonded to an end of the first bond wire 52.

The second bond wire 54 need not touch the electrically conductive elements 140, to which the first bond wire 52 is metallurgically bonded. Instead, in a particular embodiment, the ends 54A of the second bond wire 54 can be metallurgically bonded to the ends 52A of the first bond wire 52 in such way the that second bond wire does not touch the contact at at least one end of the second bond wire and may not touch the contacts at either end.

The ends 52A, 54A of each bond wire 52, 54 can include a ball formed during the wirebonding process. A wirebonding tool typically operates by advancing the tip of a gold wire from a spool to a tip of the tool. In one example of processing, when the tool is in position for forming a first wire bond at a first contact, e.g., chip contact 20, the tool can then apply ultrasonic energy, heat or both to the wire until the tip of the wire melts and forms a ball. The heated ball then metallurgically bonds with a surface of the contact. Then, when the tip of the wirebonding tool is moved away from the first contact, the ball remains bonded to the contact, while a length of the bond wire between such contact and a second contact is paid out. The wirebonding tool can then attach a second end of the wire to a second contact, forming a metallurgical joint with the second contact at that end.

The above process can then be repeated in a somewhat different fashion to form the second bond wire. In this case, the wirebonding tool can be moved into a position, and can then be used to heat the tip of the wire to form a ball which then metallurgically joins an end 54A of the second bond wire to the end 52A of the first bond wire. The wirebonding tool can then attach the other end of the bond wire to a second end of the first bond wire, forming a metallurgical joint with at least the first bond wire at that end.

Some of the electrically conductive elements 52, 54 can carry signals, i.e., voltages or currents which vary with time and which typically convey information. For example, without limitation, voltages or currents which vary with time and which represent state, change, a measurement, a clock or timing input or a control or feedback input are examples of signals. Others of the electrically conductive elements 52, may provide connections to ground or a power supply voltage. A connection to ground or a power supply voltage typically provides a voltage which is at least fairly stable with time over frequencies of interest to the operation of the circuit. Dual or multiple wire bond connections between respective pairs of contacts may be especially beneficial when the connections are to ground or a power supply voltage. In one example, the dual wire connections 72, 74 and 52, 54 can connect the respective microelectronic elements 12, 14 to ground terminals on dielectric element 30. Similarly, the dual wire bond connections 72A, 74A and 52A, 54A can connect the respective microelectronic elements to power supply terminals on the dielectric element (for further interconnection to a power supply through a circuit panel, not shown). Increasing the number of wire bonds in these connections to ground or power terminals can reduce inductance in the ground and power circuits, which can help reduce noise in the system.

Another possible benefit of a multiple bond wire structure and method according to this embodiment is to reduce inductance when area for attaching a bond wire to a contact such as a bond pad on a chip or a substrate is limited. Some chips have particularly high contact density and fine pitch. The bond pads on such chips have very limited area. A structure in which a second bond wire has an end attached to an end of a first bond wire but which itself does not touch the contact can achieve a dual or multiple bond wire structure without requiring the size of the bond pad to be increased. Thus, a multiple bond wire structure as described with respect to FIG. 2A may be achieved even when forming wire bond connections to contacts which are arranged at a fine pitch or contacts which have small area.

Moreover, some microelectronic elements having high density also have high input and output rates, i.e., high frequencies at which signals are transmitted onto or off of the chip. At sufficiently high frequencies, the inductance of a connection can increase substantially. A multiple bond wire structure according to this embodiment can substantially decrease inductance of a wire bond connection used for ground, power or signal transmission by providing an additional path for current to flow between the connected contacts.

Figure 2B:
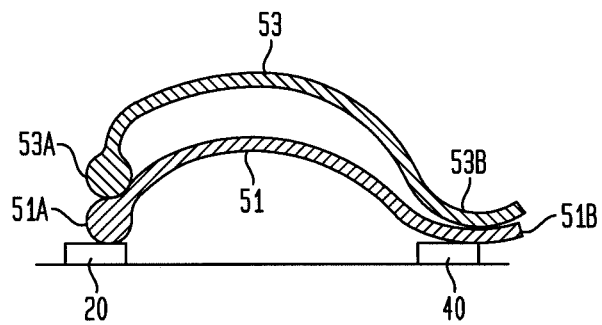
FIG. 2B is a fragmentary partial sectional view illustrating a connection between bond elements in a variation of a microelectronic assembly in an embodiment herein.
Figure 4:
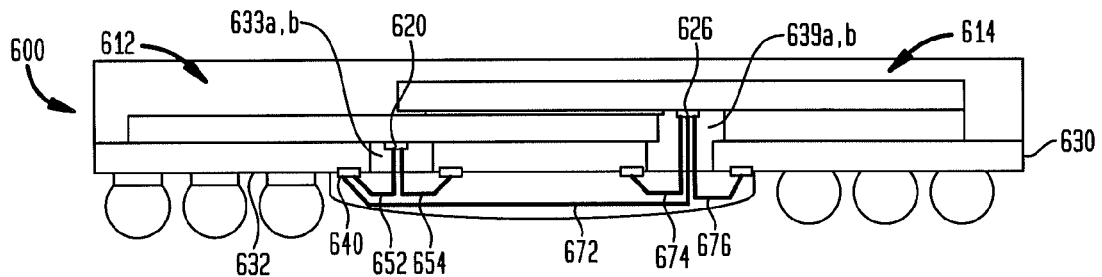
FIG. 4 is a diagrammatic sectional elevation view of a stacked microelectronic assembly according to another embodiment of the present invention.

FIG. 2B illustrates connections between a first bond wire 51 and a second bond wire 53 at ends thereof. As seen in FIG. 4, at first ends of the bond wires, the balls 51A and 53A can be metallurgically joined together, but in such manner that the ball of the second wire 53 does not touch the contact 20. At second ends 51B, 53B of the bond wires at a second contact 40, electrical connection can be made between the wires without balls being formed at the second ends 51B, 53B. In this case, one of the contacts 20, 40 can be a chip contact exposed at a surface of the chip, and another one of the contacts 20, 40 can be a substrate contact exposed at a surface of the substrate. As further seen in FIG. 2B, the second end 53B of the second wire bond is joined to the first bond wire at 51B without the second bond wire touching the contact 40.

Figure 2C:
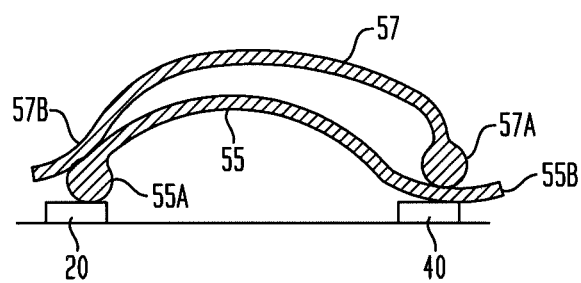
FIG. 2C is a fragmentary partial sectional view illustrating a connection between bond elements in a variation of a microelectronic assembly in an embodiment herein.

FIG. 2C illustrates a variation of such embodiment (FIG. 2B) in which, the first bond wire 55 has a ball end 55A joined to a first contact 20. A wire end 57B of the second bond wire 57 is metallurgically joined to the ball end 55A of the first bond wire above the first contact 20. In addition, a ball end 57A of the second bond wire 57 is metallurgically joined to a wire end 55B of the first bond wire 55 at the second contact 40. If desired, an even greater number of bond wires can be used which are metallurgically joined in this manner to other bond wires, so as to provide parallel electrical paths for current to flow between a pair of contacts.

FIG. 2D illustrates an electrical connection in which a bond ribbon 41 is used instead of a bond wire, wherein the bond ribbon 41 has a first end 43 metallurgically joined to one of the contacts (e.g., contact 20). The bond wire 41 has a middle portion 45 which is metallurgically joined to another contact 40, and has a second end 47 joined to the first end 43 of the bond ribbon. The joint between the first and second ends 43, 47 of the bond ribbon can be such that the second end 47 does not touch the contact 20 to which the first end is joined. Alternatively, in one variation (not shown), the second end 47 can touch or be joined directly with the same contact 20 to which the first end 43 is joined. One of the contacts, e.g., one of contacts 20, 40 can be a substrate contact and another one of the contacts 20, 40 can be a chip contact. Alternatively, both of the contacts 20, 40 can be substrate contacts exposed at a surface of a substrate, or both contacts 20, 40 can be chip contacts exposed at a surface of a chip.

As further shown in FIG. 1, the microelectronic assembly 10 may also include a first encapsulant 80 and a second encapsulant 82. The first encapsulant 80 covers electrical connections 70 and the first aperture 33 of the dielectric element 30. The second encapsulant 82 covers electrical connections 70 and the second aperture 39 of the dielectric element 30.

The microelectronic assembly 10 can further include a plurality of joining units, such as solder balls 81. Solder balls 81 are attached to terminals 36 and are therefore electrically interconnected to at least some of the elements 40, leads 50 and 70 and contacts 20 and 26.

Figure 3:
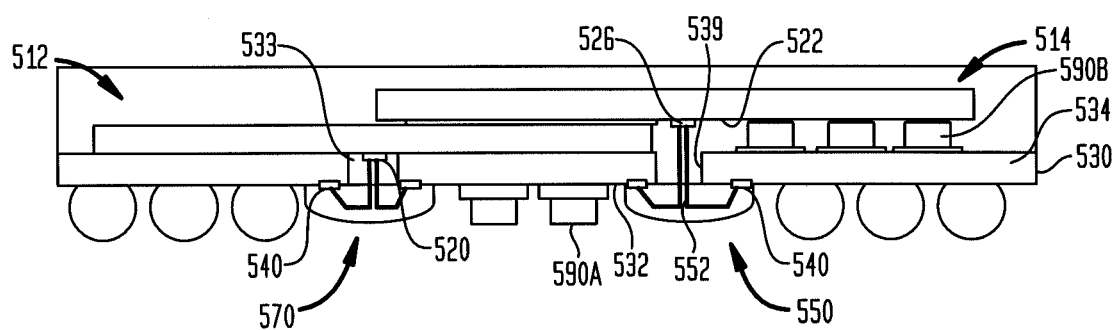
FIG. 3 is a diagrammatic sectional elevation view of a stacked microelectronic assembly according to another embodiment of the present invention.
Figure 5:
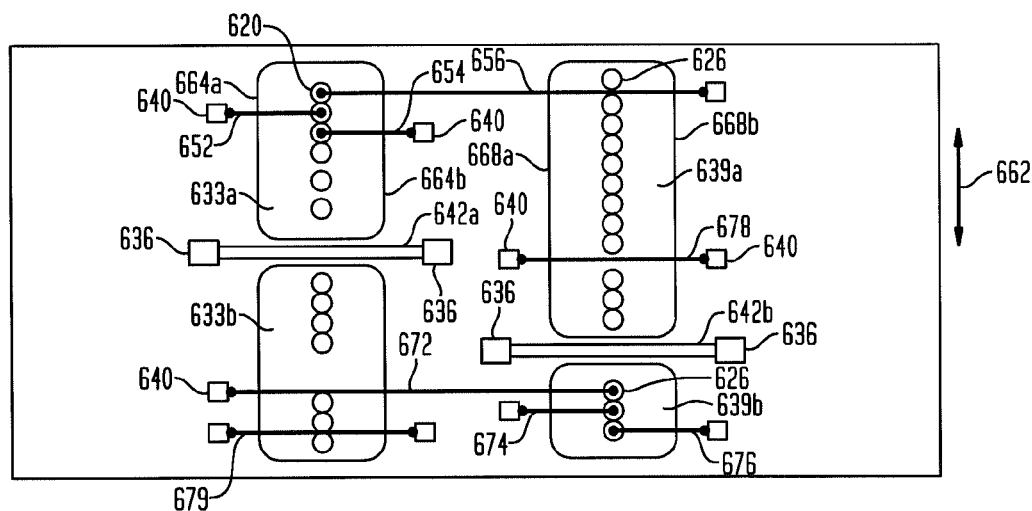
FIG. 5 is a bottom view of the stacked assembly of FIG. 4.
Figure 6:
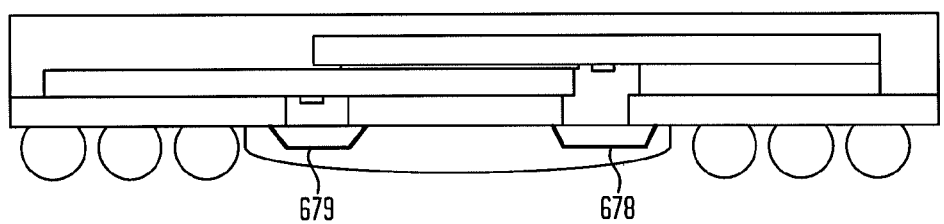
FIG. 6 is a diagrammatic sectional view of another embodiment of the stacked microelectronic assembly.

As seen in FIG. 3, a plurality of passive circuit elements, i.e., "passives" 590A can be disposed or attached to the first surface 532 of the dielectric element 530 between the first and second apertures 533 and 539. The passives 590A may be capacitors, resistors, inductors or the like. One or more passives can be electrically interconnected with one or more electrically connective elements on the dielectric element, or with one or more contacts 520, 526 of one or both microelectronic elements. One or more passives can be electrically interconnected with a microelectronic element contact 520 or 526 and with a contact 540 of the dielectric element. Alternatively, or in addition thereto, a plurality of passives 590B may be disposed between a second surface 534 of dielectric element 530 and the front surface 522 of the second microelectronic element 514. These passives 590B can be electrically interconnected to any one or all of the microelectronic elements 512, 514, or the dielectric element 530, as in the case of passive 590A. In a particular embodiment, at least some of the passives 590A or 590B are decoupling capacitors, which in one example, can be connected to "power" contacts of the microelectronic elements 512 or 514, the dielectric element 530 or both, through which power from a power supply is input to a microelectronic element FIGS. 4-6 depict a variation of the embodiment shown in FIG. 1. In this variation, the dielectric element 630 includes a plurality of apertures. Although FIG. 5 shows a dielectric element 630 with four apertures, the dielectric element 630 may include more or fewer apertures. In the specific embodiment shown in FIG. 5, the dielectric element 630 includes two apertures 633a and 633b which can be substantially aligned relative to each other in a first direction 662 of the stacked microelectronic assembly 600. The apertures 633a and 633b may have similar shapes and dimensions or may have different dimensions or shapes. For example, apertures 633a and 633b depicted in FIG. 13 each have a substantially rectangular cross-section and substantially similar dimensions. Regardless of their shape, the contacts 620 of the first microelectronic element 612 are exposed within the apertures 633a and 633b.

The dielectric element 630 may further have apertures 639a and 639b, and contacts 626 of the second microelectronic element 614 can be exposed within those apertures. Apertures 639a and 639b may also be substantially aligned with respect to each other. In the embodiment shown in FIG. 5, aperture 639a is larger than aperture 639b and both apertures have a substantially rectangular shape.

The stacked microelectronic assembly 600 includes a plurality of traces. In one specific embodiment, a conductive trace 642a can extend in a direction along a surface 632 of the dielectric element between the apertures 633a and 633b. In one embodiment, the trace 642a can have a length extending to locations 636 of the dielectric element 630 which are beyond edges 664a, 664b of an aperture 633a in a direction of the trace's length. As seen in FIG. 5, conductive structure such as terminals 636 of the dielectric element 630 may be interconnected by trace 642a. Another trace 642b can be positioned between apertures 639a and 639b and can have a length extending to locations beyond the edges 668a, 668b of the apertures 639a and 639b. Other conductive structure such as terminals 636 of the dielectric element 630 may be interconnected by trace 642b.

The stacked microelectronic assembly 600 includes a plurality of electrically conductive elements adapted to transmit a signal, e.g., signal leads, which can be wire bonds or other suitable structure. In the embodiments depicted in FIG. 4, a signal lead 652 extends through aperture 633a and electrically couples a contact 620 of the first microelectronic element 614 and a substrate contact 652 adjacent to the aperture 633a. Another signal lead 654 extends through aperture 633a and interconnects a contact 620 of the first microelectronic element 612 and substrate contact 640 adjacent to aperture 633a. As seen in FIG. 5, another signal lead 656 electrically connects a contact 620 of the first microelectronic element to a substrate contact 640 adjacent to the aperture 639a. Signal lead 656 extends across the width of aperture 639a.

A signal lead 672 connected to a contact 626 of the second microelectronic element 614 extends across the width of aperture 633b and is electrically coupled to a substrate contact 640 beyond a remote edge of the aperture 633b. Another signal lead 674 extends through aperture 639a and interconnects a contact 626 of the second microelectronic element 614 and a substrate contact 640 in a central portion of the dielectric element adjacent to aperture 639b. Similarly, signal lead 676 extends through aperture 639a and electrically couples a contact 626 of the second microelectronic element 614 and a substrate contact 640 adjacent to aperture 639b.

As seen in FIGS. 5 and 6, the stacked microelectronic assembly 600 may further include a signal lead 678 extending across the width of aperture 639a and interconnecting two substrate contacts 640 positioned on opposite sides of the aperture 639. Another signal lead 679 extends across the width of aperture 633a or 633b and interconnects two substrate contacts 640 located on opposite sides of such aperture 633a or 633b. An encapsulant may cover all the signals leads and apertures 633a, 633b, 639a and 639b.

Figure 7:
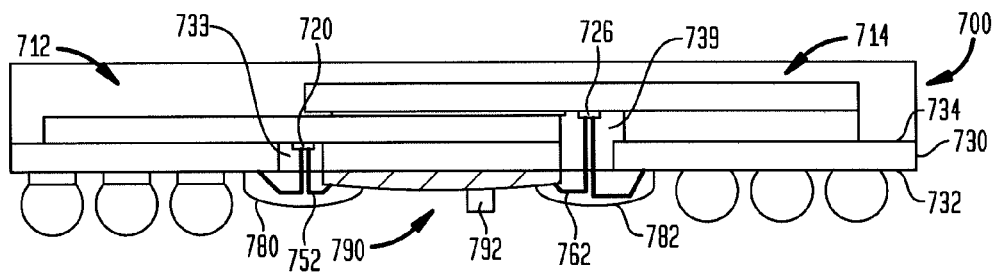
FIG. 7 is a diagrammatic sectional view of yet another embodiment of the stacked microelectronic assembly.
Figure 8:
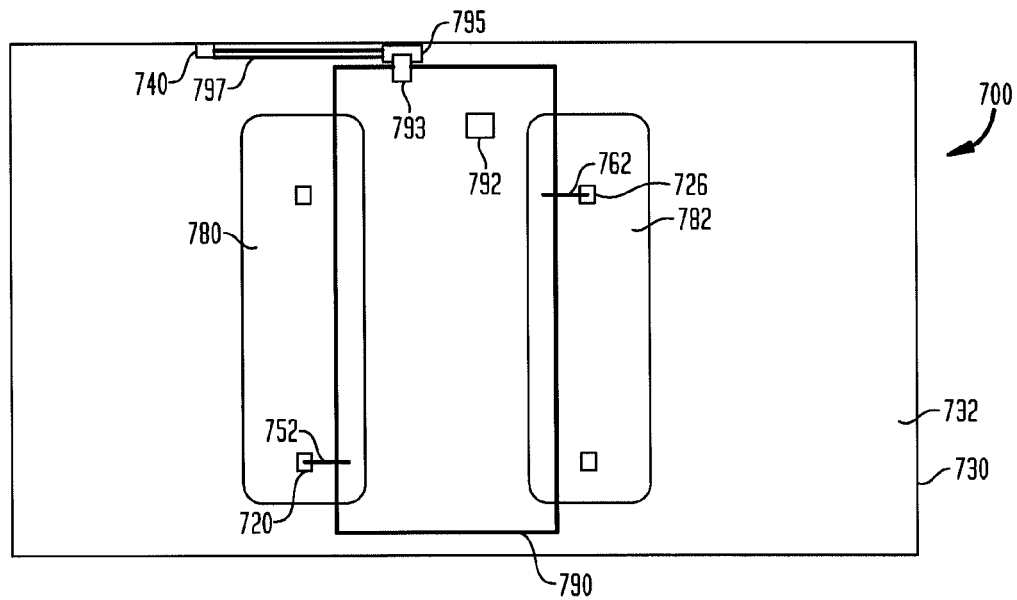
FIG. 8 is a bottom view of the stacked microelectronic assembly of FIG. 7.

FIGS. 7 and 8 show a variation of the embodiment depicted in FIG. 1. In this variation, the stacked microelectronic assembly 700 includes an electrically conductive ground and/or power plane 790 (i.e., a metal plane for connection to a reference potential) disposed on the first surface 732 of the dielectric element 730. The electrically conductive plane 790 may alternatively be disposed on the second surface 734 of the dielectric element 730. One or more wire bonds 752 extending through aperture 733 may electrically connect the contact 720 of the first microelectronic element 712 with the ground and/or power plane 390. An encapsulant 780 may cover aperture 733. Similarly, one or more wire bonds 762 extending through aperture 739 may electrically connect the contact 726 of the second microelectronic element 714 with the ground and/or power plane 790. An encapsulant 782 may cover aperture 739. The ground and/or power plane 790 may be positioned between two apertures 733 and 739 of the dielectric element 730 and at least portion of the plane 790 may extend through encapsulants 780 and 782. In one embodiment, the electrically conductive ground and/or power plane 790 may be a monolithic structure, as seen in FIG. 8.

The microelectronic assembly 700 may further include a passive 792 electrically coupled to the electrically conductive plane 790. In particular, the passive 792 may have an electrode mounted to the conductive plane 790. The passive 792 may be one or more capacitors, resistors, inductors or the like. For example, passive 792 may be one or more decoupling capacitors for effectively maintaining a constant output voltage. In one specific embodiment, the decoupling capacitor may have an electrode mounted to the conductive plane 790 and an exposed electrode remote from the conductive plane. The decoupling capacitors can store electrical energy and, in the case of a sudden voltage drop, it can provide energy to the necessary current to maintain a constant output voltage.

The microelectronic assembly 700 may additionally or alternatively include a passive 793 having one electrode connected to the electrically conductive plane 790 and another electrode connected to a conductive pad 795 on the substrate. A trace 797 may extend from the pad 795 and connect to a terminal 740. For example, terminal 740 may be for connection to a source of power when the conductive plane is used as a ground plane to be connected to a ground. Alternatively, the pad 795 or the trace 797 may be connected to a via to another metal layer or conductive feature on a surface of the dielectric element remote from the surface 732 on which the conductive plane is disposed.

Figure 9:
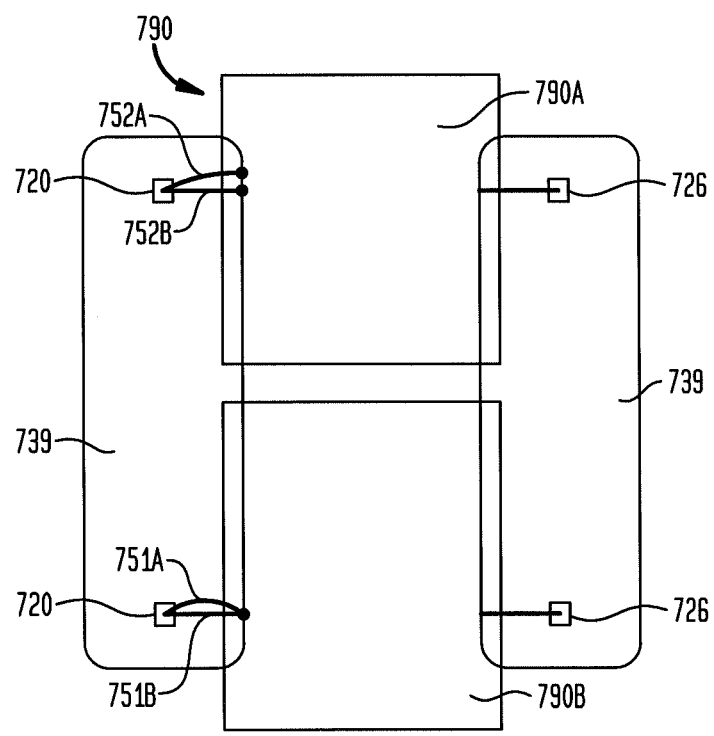
FIG. 9 is a bottom view of a stacked microelectronic assembly according to another embodiment of the present invention.

As shown in FIG. 9, the ground and/or power plane 790 can be two or more discrete plane portions spaced apart along a surface of the dielectric material 830. One or more of a power plane portion or a ground plane portion can be exposed for interconnection with one or more contacts of the first or second microelectronic elements with one or more contacts on the dielectric material, as shown above in FIG. 9. In the embodiment depicted in FIG. 9, the ground and/or power plane 790 includes two discrete portions 790A and 790B. One of the portions 790A and 790B may be a power plane portion and the other a ground plane portion. In another example, both portions 790A, 790B can be power plane portions, for example, for connection with more than one power supply input at the same or different voltages. In another example, both plane portions 790A and 790B can be ground plane portions.

As further shown in FIG. 9, dual wire bonds 752A and 752B may be connected between a contact 720 of the first or second microelectronic elements 712 or 714 and the ground and/or power plane 790. The dual wire bonds may be configured as discussed with respect to FIGS. 2A-2D. Wire bonds 752A and 752B may be connected at different locations of the ground and/or power plane 790. Alternatively, the dual wire bonds 751A and 751B may be connected at a single location of the ground and/or power plane 790.

Figure 10:
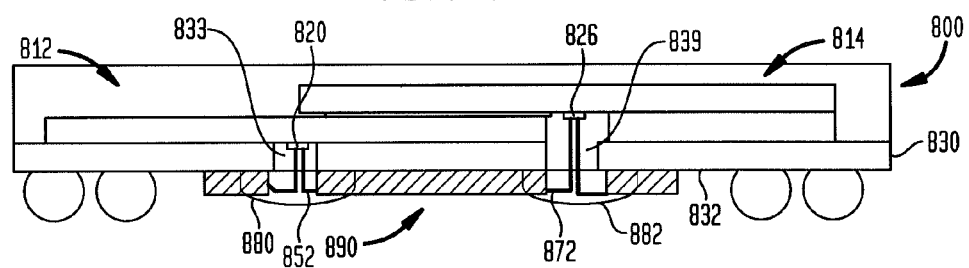
FIG. 10 is a diagrammatic sectional view of another embodiment of the stacked microelectronic assembly.
Figure 11:
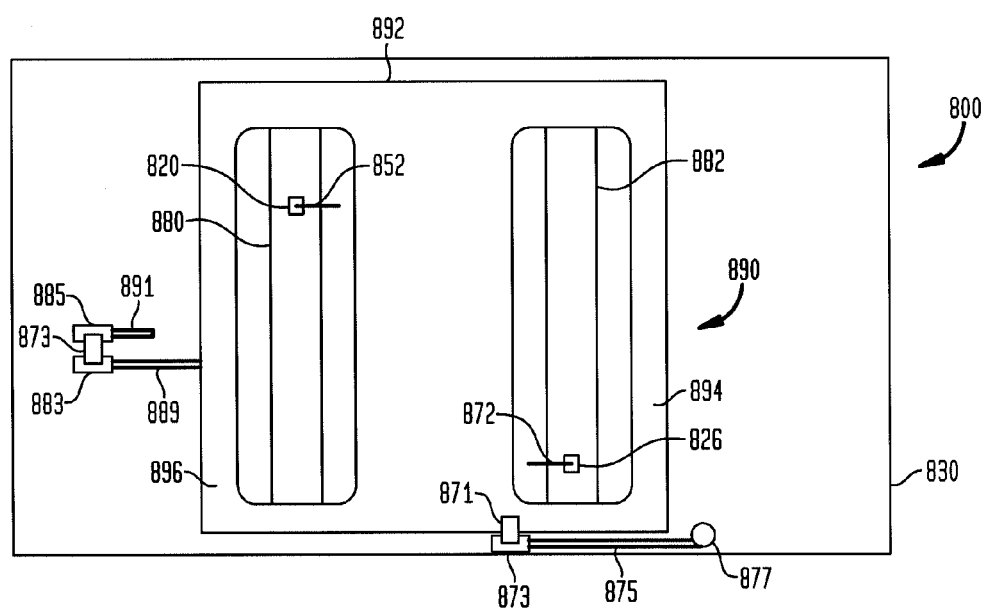
FIG. 11 is a bottom view of the stacked microelectronic assembly of FIG. 10.

FIGS. 10 and 11 show a variation of the embodiment depicted in FIGS. 7 and 8. In this variation, the stacked microelectronic assembly 800 includes an electrically conductive ground and/or power plane 890 (i.e., potential plane) centrally located on the dielectric element 830. The ground and/or power plane 890 is specifically attached to the first surface 832 of the dielectric element 830. A central portion 892 of ground and/or power plane 890 is positioned between apertures 833 and 839 of the dielectric element 830. The ground and/or power plane 890 also includes first and second end portions 894 and 896 adjacent to the central portion 892. The first and second end portions 894 and 896 of the ground and/or power plane extend beyond the boundaries of the apertures 833 and 839. Accordingly, the ground and/or power plane 890 can surround the apertures 833 and 839. One or more wire bonds 852 may electrically connect the ground or power plane 890 to one or more contacts 820 of the first microelectronic element 812. Similarly, one or more wire bonds 872 may electrically connect the ground or power plane 890 to one or more contacts 826 of the second microelectronic element 814. As seen in FIG. 11, the ground or power plane 890 may be a monolithic structure.

The microelectronic assembly 800 may include one or more passives 871 and 873. Passive 871 may be a capacitor with one electrode mounted to the electrically conductive plane 890 and another electrode connected to a pad 873. The pad may be further electrically connected as described above with respect to FIG. 7.

Passive 873 may have one electrode electrically connected to a first pad 883 and another electrode electrically connected to a second pad 885. A first trace 889 can conductively connect the first pad 883 with the electrically conductive plane 890. A second trace 891 may connect the second pad 885 to a terminal on the dielectric element, a contact to be further connected with the microelectronic element e.g., through a wire bond (not shown) or both.

Figure 12:
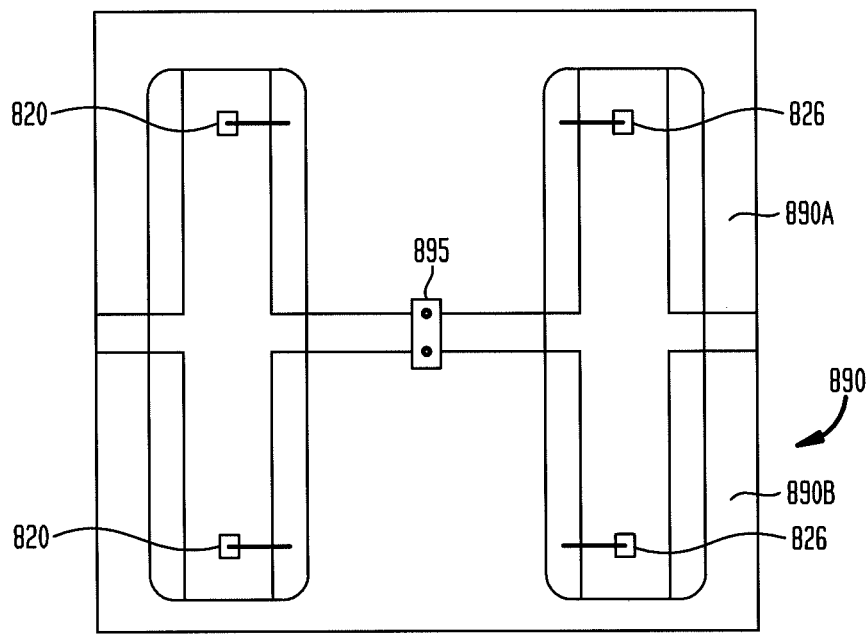
FIG. 12 is a bottom view of a stacked microelectronic assembly according to another embodiment of the present invention.

The ground or power plane can be discrete plane portions spaced apart from one another along the surface of the dielectric element 830, as illustrated in FIG. 12. In the embodiment shown in FIG. 12, the ground or power plane 890 includes two discrete plane portions 890A and 890B spaced apart from each other, one plane portion being a power plane for connection to a power source, and another plane portion being a ground plane for connection to ground e.g., through electrical connections between the plane portions and a circuit panel (not shown) to be connected to the assembly. In this embodiment, a passive 895 may be a capacitor. In such case, the passive 895 can have an electrode mounted to plane portion 890A (e.g. power) and another electrode mounted to plane portion 890B (e.g., ground) such that the capacitor electrodes are electrically connected between the power and ground planes.

Figure 13:
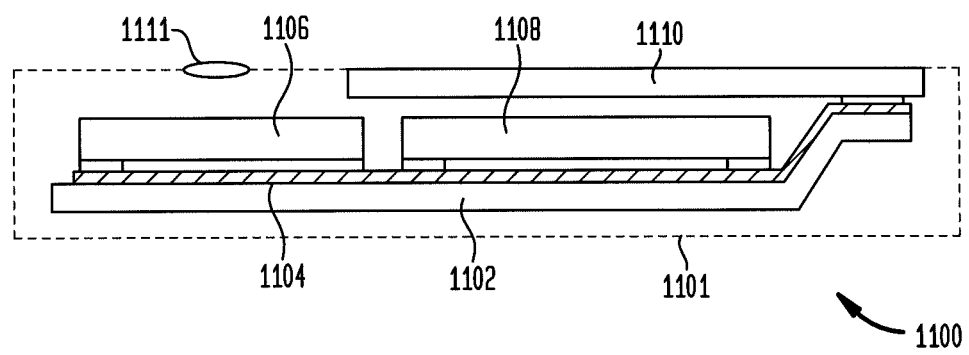
FIG. 13 is a schematic depiction of a system according to one embodiment of the invention.

The microelectronic assemblies described above can be utilized in construction of diverse electronic systems, as shown in FIG. 13. For example, a system 1100 in accordance with a further embodiment of the invention includes a microelectronic assembly 1106 as described above in conjunction with other electronic components 1108 and 1110. In the example depicted, component 1108 is a semiconductor chip whereas component 1110 is a display screen, but any other components can be used. Of course, although only two additional components are depicted in FIG. 13 for clarity of illustration, the system may include any number of such components. The microelectronic assembly 1106 may be any of the assemblies described above. In a further variant, any number of such microelectronic assemblies may be used. Microelectronic assembly 1106 and components 1108 and 1110 are mounted in a common housing 901, schematically depicted in broken lines, and are electrically interconnected with one another as necessary to form the desired circuit. In the exemplary system shown, the system includes a circuit panel 1102 such as a flexible printed circuit board, and the circuit panel includes numerous conductors 1104, of which only one is depicted in FIG. 13, interconnecting the components with one another. However, this is merely exemplary; any suitable structure for making electrical connections can be used. The housing 901 is depicted as a portable housing of the type usable, for example, in a cellular telephone or personal digital assistant, and screen 1110 is exposed at the surface of the housing. Where structure 1106 includes a light-sensitive element such as an imaging chip, a lens 1111 or other optical device also may be provided for routing light to the structure. Again, the simplified system shown in FIG. 13 is merely exemplary; other systems, including systems commonly regarded as fixed structures, such as desktop computers, routers and the like can be made using the structures discussed above.

Figure 14:
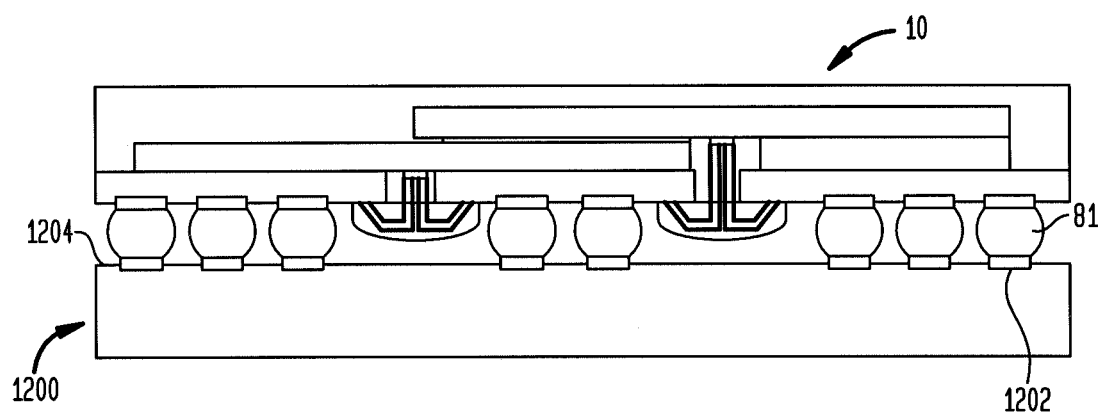
FIG. 14 is a diagrammatic sectional view of an embodiment of the stacked microelectronic assembly electrically coupled to a circuit board.

As illustrated in FIG. 14, any of the microelectronic assemblies described above may be electrically coupled to a circuit panel or board 1200. For example, microelectronic assembly 10 may include a plurality of joining units, such as solder balls 81 or copper pillars. Solder balls 81 electrically connect microelectronic assembly 10 to circuit panel 1200. While FIG. 14 only shows solder balls 81 connecting microelectronic assembly 10 to circuit panel 1200, it is contemplated that any electrically conductive element may interconnect circuit panel 1200 and microelectronic assembly 10. One or more electrically conductive elements or terminals 1202 are exposed at the first surface 1204 of the circuit panel 1200. The first surface 1204 of the circuit panel 1200 faces the solder balls 81. Solder balls 81 are attached to terminals 1202 and are therefore electrically interconnected to at least some of the circuits in circuit panel 1200.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
a dielectric element having oppositely-facing first and second surfaces and first and second apertures extending between the surfaces, the dielectric element further having a plurality of electrically conductive elements thereon;
a first microelectronic element having a rear surface and a front surface facing the dielectric element, the first microelectronic element having a plurality of contacts exposed at the front surface thereof;
a second microelectronic element having a rear surface and a front surface facing the rear surface of the first microelectronic element, the second microelectronic element having a plurality of contacts exposed at the front surface and projecting beyond an edge of the first microelectronic element;
signal leads connected to the first microelectronic element extending through the first aperture to some of the conductive elements on the dielectric element, and signal leads connected to the second microelectronic element extending through the second aperture to some of the conductive elements on the dielectric element; and
an electrically conductive plane attached to the dielectric element and at least partially positioned between the first and second apertures, the conductive plane spanning an entire distance separating the first and second apertures, the electrically conductive plane being electrically connected with one or more of the contacts of each of the first and second microelectronic elements.

2. The microelectronic assembly of claim 1, wherein the entire electrically conductive plane is positioned between the first and second apertures.

3. The microelectronic assembly of claim 1, wherein the electrically conductive plane is a power plane.

4. The microelectronic assembly of claim 1, wherein the electrically conductive plane is a ground plane.

5. The microelectronic assembly of claim 1, wherein portions of the electrically conductive plane extends to locations beyond outer edges of the first and second apertures.

6. The microelectronic assembly of claim 1, wherein the electrically conductive plane includes at least two plane portions spaced apart from each other.

7. The microelectronic assembly as claimed in claim 6, wherein the at least two plane portions include a power plane portion electrically connected to at least some power contacts of at least one of the first or second microelectronic elements, and a ground plane portion electrically connected to contacts of one or more of the first or second microelectronic elements.

8. The microelectronic assembly of claim 1, wherein the electrically conductive plane is electrically coupled to one or more contacts of the first microelectronic element.

9. The microelectronic assembly of claim 1, wherein the electrically conductive plane is electrically coupled to one or more contacts of the second microelectronic element.

10. The microelectronic assembly of claim 1, further comprising dual wire bonds connected between the electrically conductive plane and a contact of the first microelectronic element, and dual wire bonds connected between the electrically conductive plane and a contact of the second microelectronic element.

11. The microelectronic assembly as claimed in claim 1, further comprising
at least one passive component exposed at the second surface of the dielectric element and between the first and second apertures.

12. The microelectronic assembly as claimed in claim 11, wherein the at least one passive component is electrically connected to the first microelectronic element.

13. The microelectronic assembly as claimed in claim 12, wherein the at least one passive component is electrically connected to the first and second microelectronic elements.

14. The microelectronic assembly as claimed in claim 11 wherein the at least one passive component has an electrode mounted and electrically coupled to the conductive plane.

15. The microelectronic assembly as claimed in claim 14, wherein the at least one passive component is a capacitor having a second electrode remote from the conductive plane.

16. The microelectronic assembly as claimed in claim 11, wherein the at least one passive component includes at least one capacitor having an electrode connected to a conductive terminal for connection to power or ground.

17. The microelectronic assembly as claimed in claim 11, wherein the conductive plane is a first conductive plane, the microelectronic assembly further comprising a second conductive plane overlying the second surface of the dielectric element for connection to power and ground, respectively, and the at least one passive component having first and second electrodes electrically connected to the first and second conductive planes, respectively.

18. The microelectronic assembly as claimed in claim 17, wherein the at least one passive component is a capacitor.

19. The microelectronic assembly according to claim 1, wherein the signal leads are wire bonds.

20. The microelectronic assembly according to claim 11, wherein the signal leads are lead bonds.

21. A system comprising an assembly according to claim 1 or 11 and one or more other electronic components electrically connected to the assembly.

22. A system as claimed in claim 21 further comprising a housing, the assembly and the other electronic components being mounted to the housing.

* * * * *